United States Patent [19]

Clark et al.

[11] Patent Number: 5,159,423
[45] Date of Patent: Oct. 27, 1992

[54] SELF-ALIGNED, PLANAR HETEROJUNCTION BIPOLAR TRANSISTOR

[75] Inventors: Marion D. Clark, Newbury Park; William E. Stanchina, Thousand Oaks; K. Vaidyanathan, Westlake Village, all of Calif.

[73] Assignee: Hughes Aircraft Company, Los Angeles, Calif.

[21] Appl. No.: 702,211

[22] Filed: May 17, 1991

Related U.S. Application Data

[62] Division of Ser. No. 266,378, Nov. 2, 1988, Pat. No. 5,098,853.

[51] Int. Cl.$^5$ ............... H01L 29/72; H01L 23/48; H01L 29/161
[52] U.S. Cl. .................. 357/34; 357/16; 357/67; 357/68; 357/91
[58] Field of Search ............ 357/34, 16, 67, 68, 357/91

[56] References Cited

U.S. PATENT DOCUMENTS 4,683,487  7/1987  Ueyanagi et al. ............... 357/34

FOREIGN PATENT DOCUMENTS

| | | |
|---|---|---|
| 0004292 | 10/1979 | European Pat. Off. . |
| 0199497 | 10/1986 | European Pat. Off. . |
| 0206787 | 12/1986 | European Pat. Off. . |
| 0255882 | 2/1988 | European Pat. Off. . |
| 0289343 | 2/1988 | European Pat. Off. . |
| 62-81759 | 4/1987 | Japan ............... 357/34 |
| 2010580 | 6/1979 | United Kingdom . |
| 2179792 | 3/1987 | United Kingdom . |

OTHER PUBLICATIONS

Appl. Phys. Lett., 52(10), Mar. 7, 1988, "GaAs-Si Heterojunction Bipolar Transistor", J. Chen et al., pp. 822-824.
GaAs IC Symposium, IEEE Technical Digest 1985, Catalogue No. 85CH2182, pp. 53-56. "A Self-Aligned GaAs/AlGaAs Heterojunction Bipolar Transistor", T. Ohshima et al.
Chang et al., "AlGaAs/GaAs Heterojunction Bipolar Transistors, Fabricated Using a Self-Aligned Dual-Lift-Off Process", IEEE Electron Device Letts., vol. ED-L-8, No. 7, Jul. 1987, pp. 303-305.
Nakajima et al., "High Speed AlGaAs/GaAs HBTs with Proton Implanted Buried Layers", IEDM Tech. Dig., Dec. 1986, pp. 266-269.
Tully et al., "A Fully Planar Heterojunction Bipolar Transistor", IEEE Electron Device Letts., vol. ED-L-7, No. 11, Nov. 1986, pp. 615-617.

*Primary Examiner*—Mark V. Prenty
*Attorney, Agent, or Firm*—V. D. Duraiswamy; W. K. Denson-Low

[57] ABSTRACT

A heterojunction bipolar transistor (HBT) is formed with self-aligned base-emitter and base-collector junctions by forming a two-level mask over a doped base layer, sequentially forming openings in registration through the two mask layers, and using the opening in one mask layer to define the collector region and the opening in the other mask layer to define the emitter. A buried conductive layer formed by a dopant implant establishes an electrical contact to the collector region, and connects to the surface via another conductive implant that extends through a lateral extension of the collector region. The collector region itself is formed by a dopant implant, while the active base region which forms junctions with the emitter and collector is thinner than the remainder of the base layer; the latter feature reduces the resistivity associated with connections to lateral base contacts. Parasitic capacitances are minimized when the collector and buried conductive layers are implanted into a semi-insulating substrate such that only the active junction regions overlap.

6 Claims, 4 Drawing Sheets

SELF-ALIGNED, PLANAR HETEROJUNCTION BIPOLAR TRANSISTOR

This is a division of application Ser. No. 07/266,378 filed Nov. 2, 1988, and now U.S. Pat. No. 5,098,853.

BACKGROUND OF THE INVENTION

1. Field of the Invention

This invention relates to the structure and fabrication of heterojunction bipolar transistors, and more particularly to the use of selective area ion implantation in the formation of such transistors.

2. Description of the Related Art

Heterojunction bipolar transistors (HBTs) are attracting interest currently because of their potential for high speed and high frequency applications. Perhaps the two most popular current fabrication techniques for high speed HBTs are described in the following articles: the first by Chang et al., "AlGaAs/GaAs Heterojunction Bipolar Transistors Fabricated Using a Self-Aligned Dual-Lift-Off Process", *IEEE Electron Device Letters*, Vol. EDL-8, No. 7, July 1987, pages 303–5; and the second by Nakajima et al., "High Speed AlGaAs/GaAs HBTs with Proton Implanted Buried Layers", *IEDM Tech. Dig.*, December 1986 (Los Angeles), pages 266–269. In these techniques the HBTs are fabricated by mesa etching of epitaxially grown device structures. Deep mesas are required for collector contacts and possibly for device isolation, making it difficult to fabricate high density integrated circuits. More importantly, the devices also exhibit considerable parasitic capacitances, thus retarding their speed below their ultimate potential. Also, they are not readily compatible for integration with other GaAs devices such as metal-semiconductor-field-effect-transistors (MESFETs). While the emitter is self-aligned with the base, the collector is not truly self-aligned with either the emitter or base, and the base-collector overlap area is approximately three times the emitter-base junction area in the state-of-the-art HBTs. This increases the base-collector capacitance, thereby severely limiting the maximum operating frequency of the device. It is also difficult during fabrication to control the uniformity of the depth of the etch step to the base, which results in a poor yield. Another problem is that, since the emitter is only a little over a micron wide, the emitter contact tends to lap over and may short to the base contact. Finally, the device is non-planar because the collector contact is considerably below the level of the emitter contact.

The device discussed above is grown entirely by molecular beam epitaxy (MBE) or chemical vapor deposition (CVD), acting upon the surface. Another type of HBT is fabricated with a process that utilizes a two-step epitaxial deposition with an intervening selective ion implant of bases. It is described in Tully et al., "A Fully Planar Heterojunction Bipolar Transistor", *IEEE Electron Device Letters*, Vol. EDL-7, No. 11, November 1986, pages 615–17. While the surface of this device is substantially planar, the base and collector are not self-aligned. It is also relatively slow because of a high base-collector capacitance, and has a high resistance collector contact.

A fully planar HBT in an "emitter-down" configuration is disclosed in S. Evans et al., "GaAs HBT LSI/VLSI Fabrication Technology", 1987 *GaAs IC Symposium Tech. Digest*, 1987, pages 109–112. In this inverted device the base is doped by ion implantation through a top collector layer, with the emitter formed on the underside of the HBT. It is intended for high density digital logic applications where switching speeds are considerably slower than the state-of-the-art. It is not self-aligned, and is characterized by a high capacitance that makes it slow in speed.

SUMMARY OF THE INVENTION

In view of the above problems, the present invention seeks to provide a high speed, self-aligned HBT which is also substantially planar, can be used in high density integrated circuits, and is fully compatible with GaAs MESFET fabrication. The invention also seeks to provide an improved fabrication technique for such a device.

In accordance with the invention, a transistor base layer of one type doping is formed on a semi-insulating substrate, and an emitter of opposite type doping is established over the base layer. The emitter forms a junction with the base layer over a defined area. A collector region of opposite type doping to the base layer is fabricated below the base layer so as to form a junction therewith over a defined area which is substantially aligned with the base-emitter junction. A buried conductive layer within the substrate establishes an electrical connection with the collector region. Base and emitter contacts are then provided, and a collector contact is made to the collector region via the buried layer, lateral to the collector region.

In the preferred embodiment the collector region is lightly doped, while the buried layer is of the same type doping but heavily doped, and contacts the underside of the collector region. An extension of the collector region extends laterally over the buried layer, such that the collector contact establishes an electrical contact with the buried layer through the collector region extension. That extension includes a generally conductive ion implant region (either an actual implant or a diffused region) which extends from the collector contact down to the buried layer.

A substantially planar surface is established by providing the collector contact as a generally conductive layer of semiconductor material of substantially equal thickness to the emitter, surmounted by a metallic contact. This allows the thickness of the collector region to be substantially greater than either the base layer or the emitter, without degrading the planarity.

The base layer preferably has an active region which forms the base-emitter and base-collector junctions, together with an extension which extends laterally from the active region to the base contact. The base extension is substantially thicker and has a substantially lower resistivity in the lateral direction than the active base region.

In the preferred method of forming the HBT, the doped base layer is formed in a selective area on the semi-insulating semiconductor substrate. The aligned base-emitter and base-collector junctions are defined by an opening in a mask placed over the doped base layer. Dopant particles of opposite type doping to the base doping are implanted into the substrate immediately below the base layer through the junction defining opening to establish tee collector region. An emitter is then formed over the base through the same mask opening. The mask comprises a bottom electrically insulative layer surmounted by an implant absorbing layer. The junction defining opening is formed in the implant absorbing layer for implantation of the collector region, while the junction defining opening is formed in the insulative layer in registration with the opening in the implant absorbing layer for formation of the emitter. The implant absorbing layer may be removed prior to formation of the emitter, which may be either epitaxially grown or deposited by chemical vapor deposition over the base layer.

Further features and advantages of the invention will be apparent to those skilled in the art from the following detailed description, taken together with the accompanying drawings, in which:

DETAILED DESCRIPTION OF THE INVENTION

Figure 1:
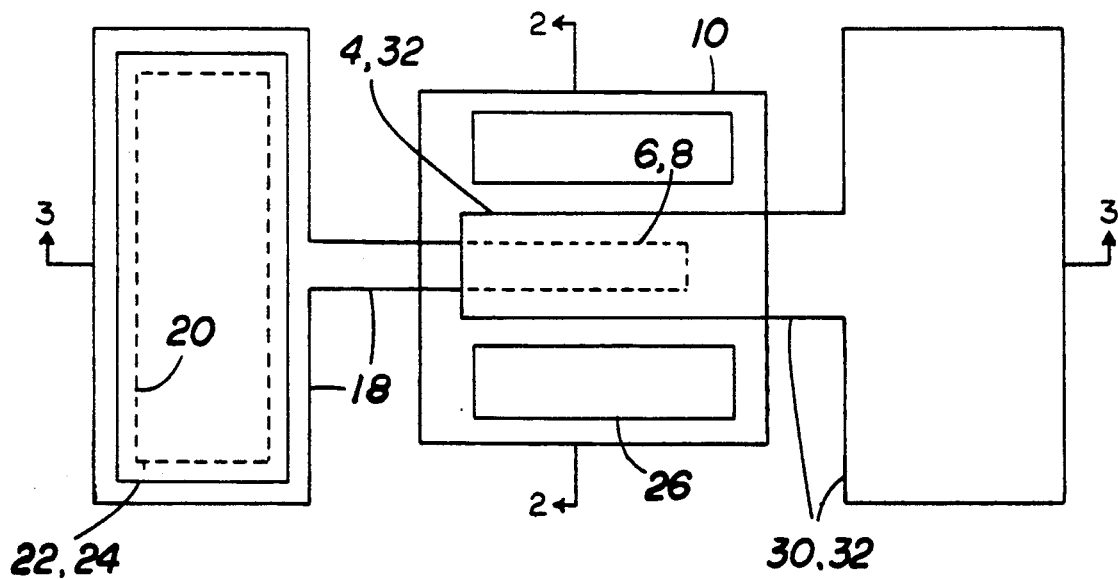
FIG. 1 is a plan view showing the layout of a HBT in accordance with the invention.
Figure 2:
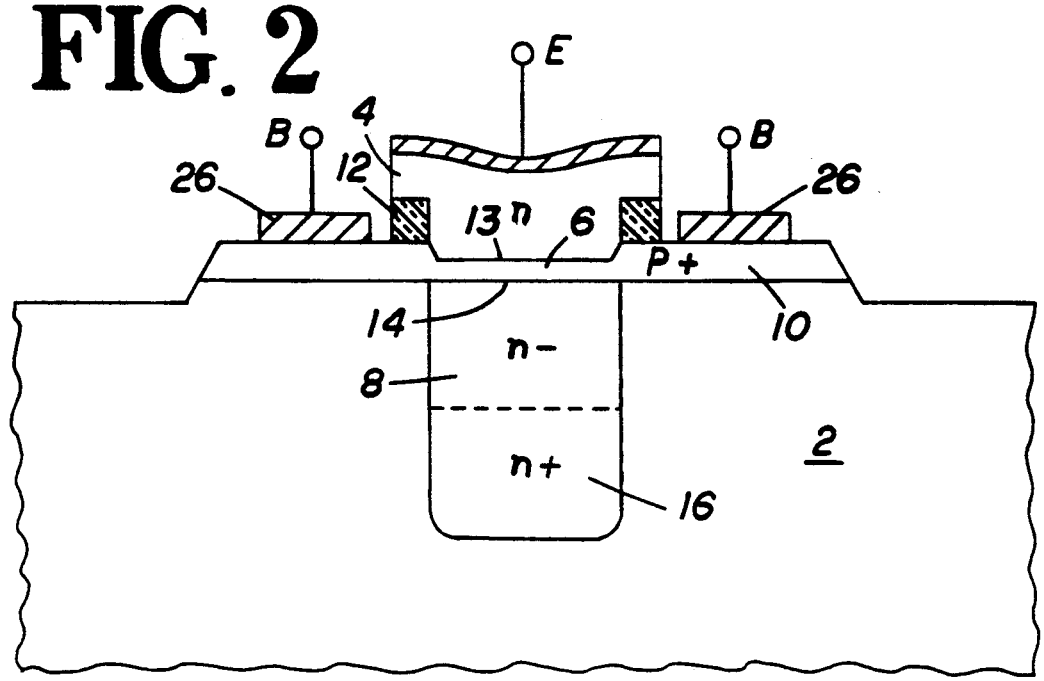
FIGS. 2 and 3 are sectional views of the HBT of FIG. 1, taken along section lines 2—2 and 3—3, respectively.
Figure 3:
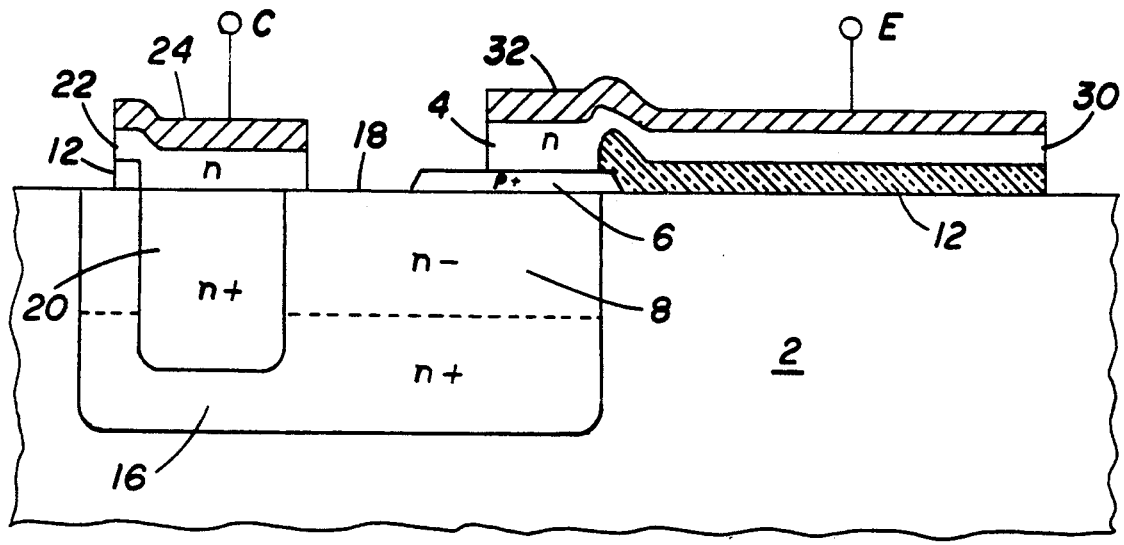

The basic configuration of a preferred embodiment of the invention is shown in FIGS. 1-3. An HBT is formed on a semi-insulating substrate 2, preferably GaAs. The device consists of a vertical arrangement of an emitter 4 over an active base region 6, below which a collector region 8 is formed in the substrate. The active base region 6 is part of a larger base layer 10 which extends further over the substrate, but the active region has a lesser thickness than the remainder of the base layer. The active base region 6 is bounded and defined along its longer sides by the inner opposed walls of a pair of insulative blocks 12. A base-emitter junction 13 is formed between insulating blocks 12, and is vertically aligned with the base-collector junction 14. The base-emitter and base-collector junctions are thus substantially aligned with each other, resulting in a significant increase in the operating speed of the HBT compared to prior devices that were not fully aligned. The only significant area of non-alignment occurs at the left end of the junction area (best shown near the center in FIG. 3), where the active base region 6 overlaps on the collector region 8 slightly beyond the limit of emitter 4. This overlap is deliberately provided during processing to assure that the emitter does not extend beyond the base and contact the collector due to processing tolerances. However, the amount of overlap is relatively small (about 1-2 microns) compared to the total length of the active base region (typically about 30 microns). Together with the fact that the active base region is much longer than it is wide (typically about 30 microns long vs. 1-2 microns wide), the actual amount of misalignment between the base-emitter and base-collector junctions is quite small, and does not substantially detract from the operating advantages of a device with absolute alignment.

The collector region 8 is relatively lightly doped. Electrical contact with it is made via a buried layer 16 of higher doping concentration and conductivity. Buried layer 16 contacts the underside of collector region 8 and extends laterally from the transistor junction, under a lateral extension 18 of the collector region. A highly doped implant 20 projects downward through the collector extension to contact the buried layer 16. Implant 20 is doped sufficiently to be substantially conductive, and thereby provides an electrical connection between the surface and the underside of collector 8 via buried layer 16.

To enhance the planarity of the device, an n-doped layer 22 identical to emitter 4 is grown over the conductive implant 20. This tends to reduce the variation in height of the various device elements over the surface of the substrate, especially when compared to the total depth of the device. A metallic collector contact pad 24 is formed over n-type layer 22. The metallic base contact pad 26 is provided over the portions of the base layer 10 lateral to active region 6. Collector contact pad 24 establishes an electrical contact with the collector region via the generally conductive n-doped region 22, the implant 20, and the buried layer 16. The base contact pad 26 makes electrical contact with the active base region 6 via the lateral portions of base layer 10, which it will be remembered are thicker and have a lower resistivity than the active base region.

To establish an emitter contact, an extension 30 of the emitter projects along the substrate surface on the opposite side of the device from the collector contact. Both the emitter 4 and its extension 30 are surmounted by a conductive metal layer 32 which serves as a low resistance ohmic contact to the semiconductor. Thus the same semiconductor 4,30 and metal contact 32 that forms the emitter structure also forms the collector contact structure 22,24 over the vertical highly conductive channel 20 to the buried collector 16. The base contact is self-aligned to the emitter stripe 4 and emitter contact 32 along the length of the active region 6, as explained below.

Typical specifications for the device, which are by way of example only and are not to be taken as limiting, are as follows. The active base region 6 may be about 0.08 microns thick, the lateral portions of base layer 10 about 0.2 microns thick, the emitter 4 about 0.5 microns, the collector region 8 and the buried layer 16 about 0.7 microns each, and the planar assist layer 22 of equal thickness to the emitter at about 0.5 microns. Typical doping ranges are: $1-10\times 10^{19}/cm^3$ for the active base region 6, $3-5\times 10^{17}/cm^3$ for the emitter 4 and layer 22, $1-5\times 10^{16}/cm^3$ for the collector region 8, and $10^{18}/cm^3$ for the buried layer 16 and implant 20.

Figure 4:
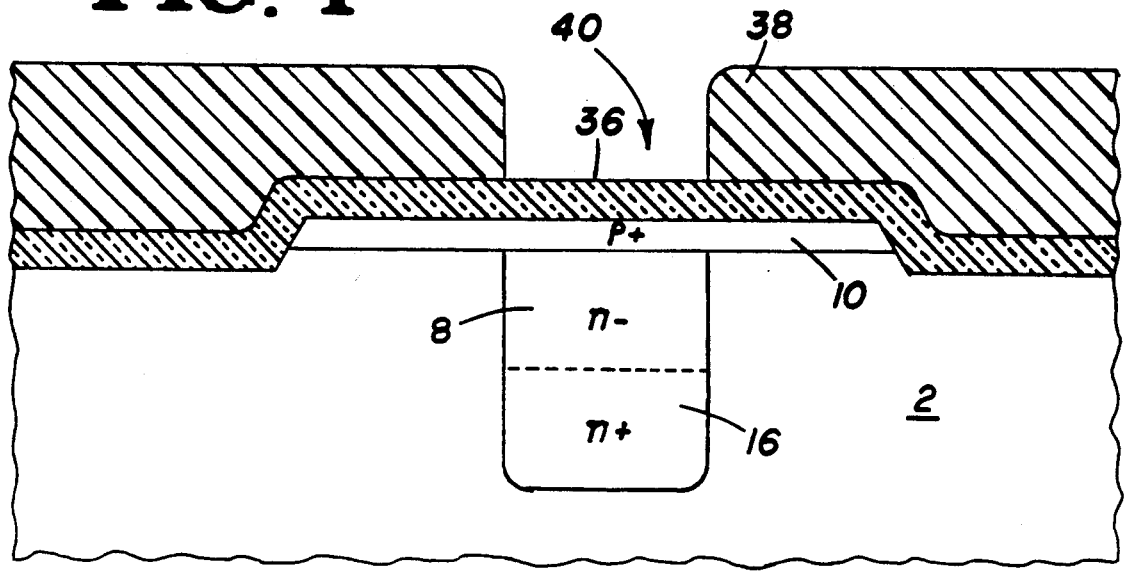
FIGS. 4–8 are sectional views showing successive steps in the fabrication of the HBT shown in FIGS. 1-3.

The preferred process for fabricating the HBT of FIGS. 1-3 is illustrated in FIGS. 4–8. FIG. 4 shows an initial stage of the fabrication. The p+ GaAs base layer 10 is first epitaxially grown over the GaAs substrate 2, using either molecular beam epitaxy or metal organic chemical vapor deposition. At this point the active base region has not yet been formed. The desired dimensions of the base layer are achieved by a selective mask and etching process. Next, an insulating layer 36 such as SiO$_2$ is deposited over the entire surface. This is followed by a layer of photoresist 38 over the insulating layer. An opening 40 is formed in the photoresist by standard photolithographic techniques immediately over the area intended for the emitter-base and base-collector junctions. A high energy silicon implant is next made through opening 40 to form the collector region 8 and buried layer 16. In one example this implant was performed at 1 MeV. The photoresist 38 surrounding opening 40 prevents penetration by the implant ions, thereby confining the implant to the desired regions within the substrate. Collector contact implant 20 (FIGS. 1, 3) is made through a separate opening in the photoresist.

Figure 5:
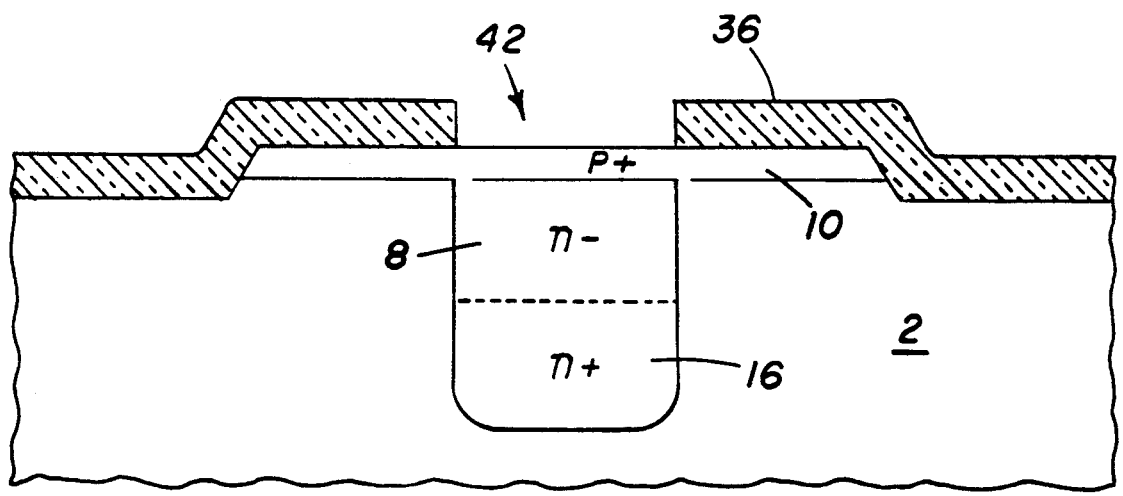

Insulating layer 36 and photoresist layer 38 may collectively be considered to form a mask for processing the device. Once the collector region 8 and buried layer 16 have been implanted, opening 40 in the photoresist layer is extended through the oxide layer 36 by a plasma etch. The photoresist is then stripped off, leaving the oxide layer with an alignment opening 42 as shown in FIG. 5. At this point the implants are annealed to make them electrically active dopants by heating the wafer, according to one technique, to 850° C. for 30 minutes with an arsine ($AsH_3$) overpressure.

Figure 6:
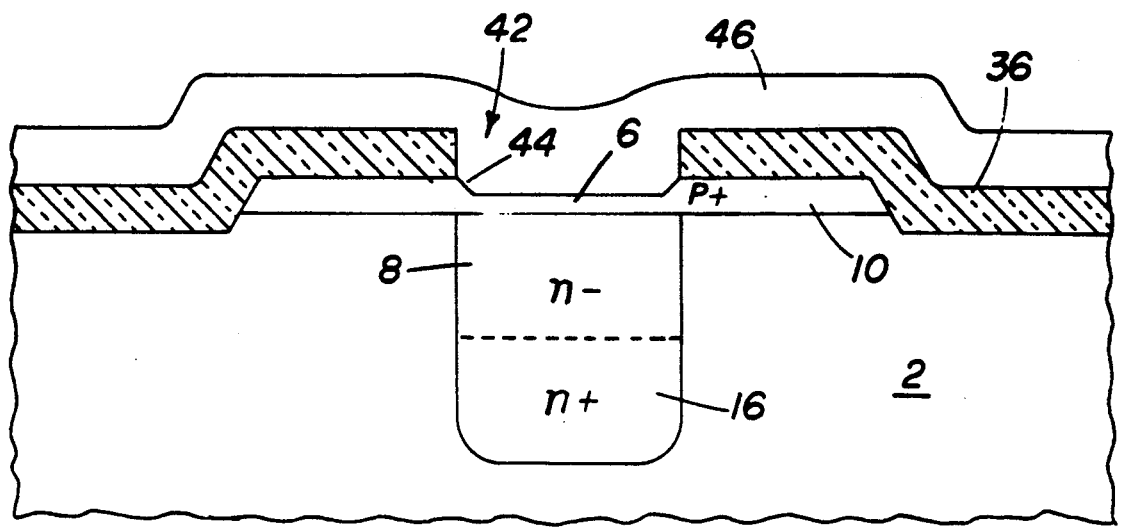

The active base region is then etched to thin it, using the existing oxide layer 36 as a mask. Wet chemical etching can be used to controllably thin the active base region to about 800 Angstroms, for example. A proper orientation of the oxide mask to the crystallographic planes of the underlying material will yield sloped side walls 44 as shown in FIG. 6. In the next step, also shown in FIG. 6, an epitaxial emitter structure is grown over the entire wafer, using either molecular beam epitaxy or metal organic chemical vapor deposition. Emitter layer 46 is nominally $Al_{.3}Ga_{.7}As$. At the same time, the planar-assist layer 22 is grown over the collector contact implant 20 through another opening in the oxide layer. A conventional cap is then grown on top of the emitter material. The cap may comprise a thin layer (about 300 Angstroms) of GaAs which compositionally grades to a layer of InGaAs with the same high n+ doping. The InGaAs layer is on the order of 1,000 Angstroms thick, and permits very low resistance, non-alloyed emitter contacts to be formed subsequently. The same cap structure is also applied over the layer 22 for the collector contact.

Figure 7:
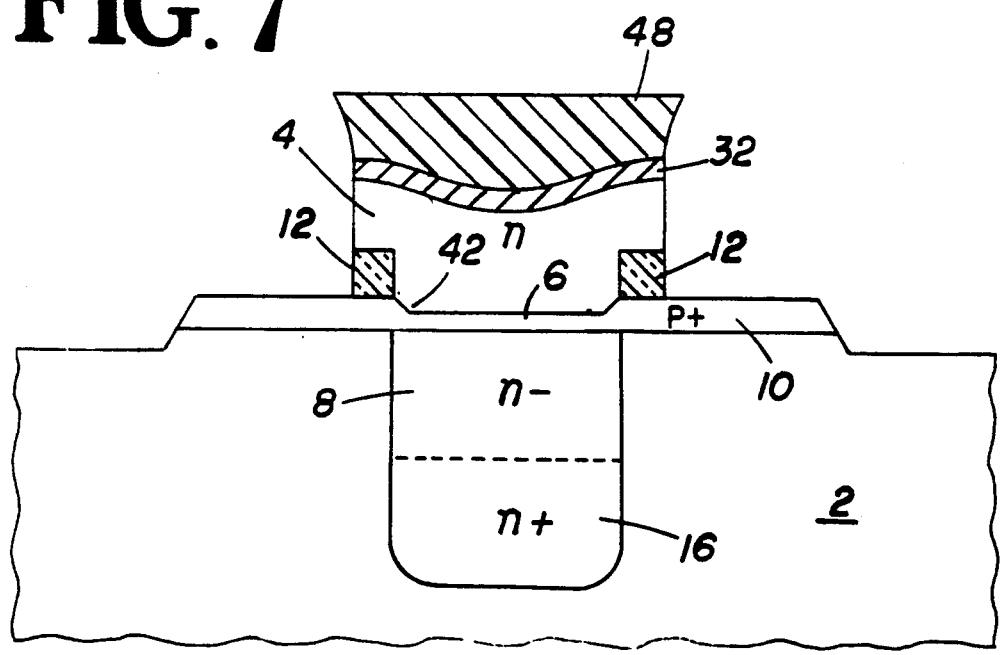

The result of the next several steps is illustrated in FIG. 7. First, a metallic layer such as tungsten is sputter deposited over the entire surface. This forms the metallization for the emitter and collector contacts to be defined subsequently. Next, a photoresist 48 is laid down over the entire surface and a selective photolithography process used to mask the emitter 4,30 and collector 22 contact areas. A plasma etch is performed to define the metal contact 32 for the emitter from the tungsten deposit, and a similar contact (element 24 in FIGS. 1 and 3) for the collector. The emitter 4 is defined by a wet oxide layer is plasma etched away down to the base layer 10, except under the emitter area which is masked by photoresist section 48. The plasma etch leaves the oxide blocks 12 defining the opposite edges of the active base area.

Figure 8:
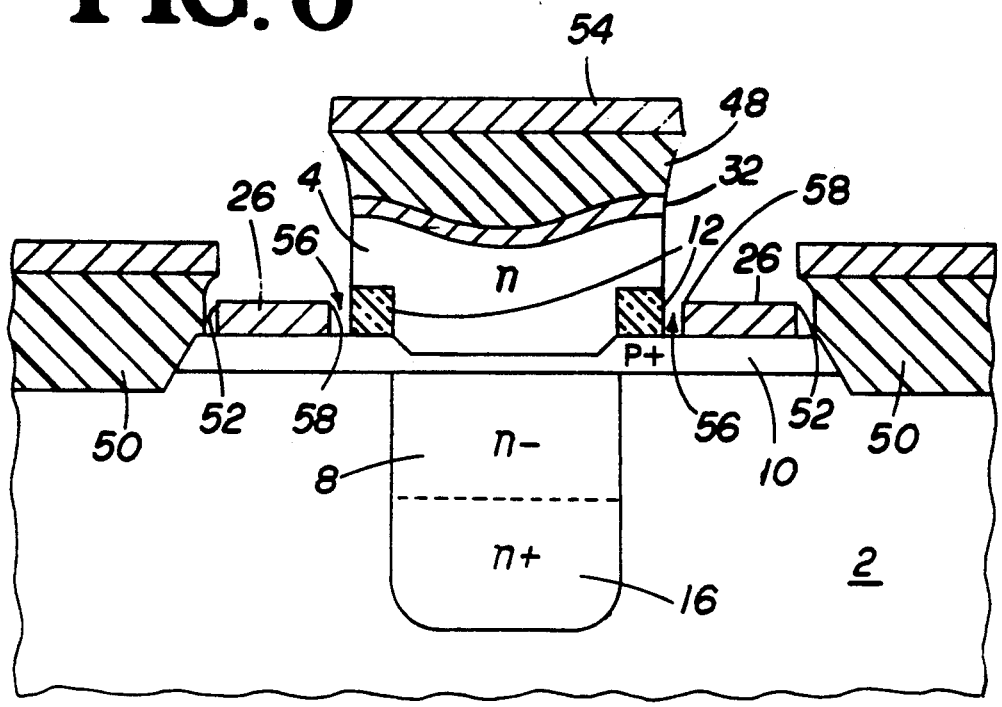

Referring now to FIG. 8, after the emitter structure has been formed a positive photoresist 50 and selective photolithography is used to define the outer boundaries 52 for the base metal ohmic contacts, followed by the evaporation of Au/Mn or other suitable p-type ohmic contact metal 54 to form the base contact 26. The self-alignment between the base contact pad 26 and the emitter stripe 4 and emitter contact 32 results from an undercut in photoresist 48 masking the emitter structure 4,32. The ledge on the top of photoresist 48 shadow masks the base metal deposition to create the gap 56 between the inner base metal edges 58 and insulative blocks 12. The outer boundaries 52 of the base metal are defined by the separate photoresist layer 50.

Finally, the metal at areas removed from the desired contacts is lifted off by dissolving the underlying photoresist. and the wafer undergoes a rapid thermal anneal (for example 400° C. for 30 seconds) to sinter the metal contacts for good ohmic behavior. The result is the planar self-aligned HBT depicted in FIGS. 1–3.

Since the base-collector junction is defined by the opening 40 in photoresist layer 38 (FIG. 4) and the base-emitter junction is defined by the opening 42 in oxide layer 36 (FIG. 6), with openings 42 and 44 in direct registration with each other, the two transistor junctions are automatically self-aligned. The resulting HBT is substantially planar, minimizes extrinsic capacitances and base resistance to enhance the high speed operation, is suitable for high density integrated circuits, and is also fully compatible with GaAs MESFET fabrication techniques. GaAs MESFET fabrication also relies upon silicon ion implantation into semi-insulating GaAs substrates and refractory metals such as tungsten for their gate electrodes.

While several illustrative embodiments of the invention have been shown and described, numerous variations and alternate embodiments will occur to those skilled in the art, without departing from the spirit and scope of the invention. These may include semiconductor compositional variations, including the use of InP or other IIIV compound semiconductor materials as the semi-insulating substrate. When InP is used for the substrate, a narrower bandgap $Ga_xIn_{1-x}As$ base layer is preferred, along with a $Al_yIn_{1-y}As$ emitter layer having a wider bandgap than the base layer. Accordingly it is intended that within the scope of the appended claims, the present invention may be practiced otherwise than as specifically described.

We claim:

1. A self-aligned, heterojunction bipolar transistor (HBT), comprising:
    a semi-insulating substrate,
    a transistor base layer of one type doping on the substrate,
    an emitter formed over the base layer and of opposite type doping to said base layer, said emitter forming a junction with the base layer over a defined junction area,
    a doped collector region formed in the substrate below the base layer and of opposite type doping to said base layer, said collector region forming a junction with the base layer over a defined junction area which is substantially aligned with said base-emitter junction, wherein said collector region is lightly doped, and said buried conductive layer is a heavily doped layer of same type doping as said collector region, said buried layer contacting the underside of said collector region,
    base and emitter contacts on said base layer and emitter, respectively, establishing electrical contacts with said base layer and emitter,
    a buried conductive layer in said substrate establishing an electrical connection with said collector region, and
    a collector contact means for establishing an electrical contact with said buried conductive layer, and thereby with said collector region, and
    further comprising an extension of said collector region extending laterally from the collector region over said buried conductive layer, said collector contact establishing an electrical contact with said buried conductive layer through said collector region extension.

2. The HBT of claim 1, wherein said collector extension includes a generally conductive ion implant region extending from the collector contact at the substrate surface to said buried conductive layer.

3. A self-aligned, heterojunction bipolar transistor (HBT), comprising:
- a semi-insulating substrate,
- a transistor base layer of one type doping on the substrate,
- an emitter formed over the base layer and of opposite type doping to said base layer, said emitter forming a junction with the base layer over a defined junction area,
- a doped collector region formed in the substrate below the base layer and of opposite type doping to said base layer, said collector region forming a junction with the base layer over a defined junction area which is substantially aligned with said base-emitter junction,
- base and emitter contacts on said base layer and emitter, respectively, establishing electrical contacts with said base layer and emitter,
- a buried conductive layer in said substrate establishing an electrical connection with said collector region, and
- a collector contact means for establishing an electrical contact with said buried conductive layer, and thereby with said collector region,
- wherein said emitter contact comprises a metallic layer over the emitter, said collector contact comprises a generally conductive layer of semiconductor material of substantially equal thickness and of substantially equal composition and doping to said emitter and a metallic layer over said semiconductor layer of substantially equal thickness to said emitter contact metallic layer, whereby the surface of said HBT is substantially planar with respect to its depth.

4. A self-aligned, heterojunction bipolar transistor (HBT), comprising:
- a semi-insulating semiconductor substrate,
- a transistor base layer of one type doping on the substrate, said base layer having an active region of reduced thickness compared to the remainder of the base layer,
- a set of insulative regions on said base layer bounding said active region,
- an emitter formed over said base layer and of opposite type doping to said base layer, said emitter forming a junction with said active base region and being defined by said insulative regions,
- a doped collector region formed in the substrate below the base layer and of opposite type doping to said base layer, said collector region forming a junction with said active base region in substantial alignment with said base-emitter junction,
- base and emitter contacts on said base layer and emitter, respectively, establishing electrical contacts with said base layer and emitter,
- a buried conductive layer in said substrate below said collector region of same type but heavier doping as said collector region, said buried conductive layer establishing an electrical contact with said collector region, and
- a collector contact means for establishing an electrical contact with said buried conductive layer, and thereby with said collector region.

5. A self-aligned, heterojunction bipolar transistor (HBT), comprising:
- a semi-insulating semiconductor substrate,
- a transistor base layer of one type doping on the substrate, said base layer having an active region of reduced thickness compared to the remainder of the base layer,
- a set of insulative regions on said base layer bounding said active region,
- an emitter formed over said base layer and of opposite type doping to said base layer, said emitter forming a junction with said active base region and being defined by said insulative regions,
- a doped collector region formed in the substrate below the base layer and of opposite type doping to said base layer, said collector region forming a junction with said active base region in substantial alignment with said base-emitter junction,
- base and emitter contacts on said base layer and emitter, respectively, establishing electrical contacts with said base layer and emitter,
- a buried conductive layer in said substrate below said collector region of same type but heavier doping as said collector region, said buried conductive layer establishing an electrical contact with said collector region, and
- a collector contact means for establishing an electrical contact with said buried conductive layer, and thereby with said collector region,
- wherein said collector contact means comprises a conductive contact pad and an ion implant region in the substrate establishing an electrical connection between said pad and said buried conductive layer.

6. The HBT of claim 5, wherein said emitter contact comprises a conductive layer over the emitter, said collector contact means includes a conductive layer of substantially equal thickness to said emitter surmounted by said contact pad, and the thickness of said collector region is substantially greater than the thickness of either said base layer or said emitter, whereby the surface of said HBT is substantially planar with respect to its depth.

* * * * *